US008349074B2

United States Patent
Ohtsuna et al.

(10) Patent No.: US 8,349,074 B2
(45) Date of Patent: Jan. 8, 2013

(54) METHOD FOR DETECTING DIAMETER OF SINGLE CRYSTAL, SINGLE-CRYSTAL MANUFACTURING METHOD BY USING THE SAME AND SINGLE-CRYSTAL MANUFACTURING APPARATUS

(75) Inventors: Hiroshi Ohtsuna, Echizen (JP); Atsushi Iwasaki, Echizen (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 13/061,586

(22) PCT Filed: Sep. 24, 2009

(86) PCT No.: PCT/JP2009/004809
§ 371 (c)(1),
(2), (4) Date: Mar. 1, 2011

(87) PCT Pub. No.: WO2010/047039
PCT Pub. Date: Apr. 29, 2010

(65) Prior Publication Data
US 2011/0146564 A1 Jun. 23, 2011

(30) Foreign Application Priority Data
Oct. 21, 2008 (JP) ................................. 2008-271206

(51) Int. Cl.
*C30B 15/26* (2006.01)
(52) U.S. Cl. ................ 117/15; 117/11; 117/13; 117/14; 117/200; 117/201; 117/202; 117/206; 117/208
(58) Field of Classification Search .................... 117/11, 117/13–15, 200–202, 206, 208, 931–932
See application file for complete search history.

(56) References Cited

U.S. PATENT DOCUMENTS

| 5,240,684 A | * | 8/1993 | Baba et al. | ...................... 117/14 |
| 5,888,299 A | | 3/1999 | Urano et al. | |
| 5,961,716 A | * | 10/1999 | White et al. | ..................... 117/14 |

(Continued)

FOREIGN PATENT DOCUMENTS
JP A-2-164789 6/1990
(Continued)

OTHER PUBLICATIONS

International Preliminary Report dated May 5, 2011 issued in PCT/JP2009/004809. (with translation dated May 26, 2011).

(Continued)

*Primary Examiner* — Michael Kornakov
*Assistant Examiner* — Kenneth A Bratland, Jr.
(74) *Attorney, Agent, or Firm* — Oliff & Berridge, PLC

(57) ABSTRACT

A method for detecting a diameter of a single crystal at the time of pulling the single crystal from a silicon melt contained in a crucible according to the Czochralski method, the method including at least: using two cameras placed equidistant from each other as a target diameter upon forming a straight-body portion of the single crystal and face both ends of the diameter of the single crystal in a growth point of the single crystal respectively, to separately capture both of the ends of the growth point of the single crystal from an outside of a furnace, the growth point being a contact point between the single crystal and a melt surface; and detecting the diameter of the single crystal on the basis of the captured images. As a result, diameter detection precision is improved.

4 Claims, 5 Drawing Sheets

U.S. PATENT DOCUMENTS 6,030,451 A * 2/2000 LaBrie et al. .................. 117/14
6,341,173 B2 * 1/2002 Altekruger et al. ........... 382/141

FOREIGN PATENT DOCUMENTS

| JP | A-9-235182 | 9/1997 |
| JP | A-2000-239093 | 9/2000 |
| JP | A-2004-35352 | 2/2004 |

OTHER PUBLICATIONS

International Search Report issued in International Application No. PCT/JP2009/004809 on Nov. 17, 2009 (with translation).

* cited by examiner

METHOD FOR DETECTING DIAMETER OF SINGLE CRYSTAL, SINGLE-CRYSTAL MANUFACTURING METHOD BY USING THE SAME AND SINGLE-CRYSTAL MANUFACTURING APPARATUS

TECHNICAL FIELD

The present invention relates to a method for detecting a diameter of a single crystal at the time of pulling the single crystal from a silicon melt contained in a crucible according to the Czochralski method (the CZ method), a single-crystal manufacturing method by using the same, and single-crystal manufacturing apparatus.

BACKGROUND ART

In recent years, the quality of a single crystal according to the CZ method, for example a defect-free crystal, has become higher, and a size thereof has become larger, for example a diameter of 300 mm or more. Particularly in manufacture of the single crystal having a large diameter, when the diameter of the single crystal is too large in comparison with a target diameter due to a detection error of the diameter of the single crystal, it affects finish processing as a cutting loss, and results in a great waste of raw materials.

In a conventional method for detecting the diameter of the single crystal, a meniscus ring, which is seen at the boundary between the crystal and a melt surface in a furnace, is usually captured by using a TV camera fastened at a chamber window. A maximum diameter (a diameter) or a position of the meniscus ring is measured with an image-processing unit from a captured image, and a value of the diameter of the single crystal is calculated on the basis of a placing angle of the camera, a lens to be used, a distance to the crystal and the like.

However, in the event that a relative position of the camera and the crystal changes, for example in the case of a small positional difference of the camera due to re-setting of the chamber after finishing a batch or the case of a positional difference of the melt surface during pulling of the crystal from an expected position, this method generates an error of the calculation of the diameter value.

For example, the melt contained in the crucible decreases, during pulling of the single crystal, by an amount corresponding to the amount of becoming a single crystal, and the position of the melt surface descends. An amount of the descent is accordingly calculated and the crucible is raised with an apparatus for driving the crucible vertically so as to locate the position of the melt surface at its original position. The calculate value, however, may differ from an actual amount of the descent so that the position of the melt surface changes in some cases. As shown in FIG. 7, in the event that the melt surface gradually descends, even when the single crystal has the same diameter, a distance from the camera to the crystal becomes further, and the captured image becomes smaller. As a result, a smaller diameter than an actual diameter is detected so that an error is generated.

The detection error of the diameter of the single crystal due to the position of the melt surface as described above causes an occurrence of variation of the diameter of the manufactured single crystal. That is, when the position of the melt surface is not a desired position, the diameter of the crystal to be grown changes during pulling, and consequently a lower part of the crystal becomes thicker or thinner. There is a difference of a heat environment for a crystal length between the crystal having a thicker lower part and the crystal having a thinner lower part, and the difference causes variation of the quality. In view of this, a method for obtaining the initial position of the melt surface has been suggested to stabilize the diameter of the crystal (See Patent Literature 1, for example).

It is, however, hard to remove the variation of the diameter of the single crystal by this method, and a predetermined diameter is set to a larger diameter to take account of the variation. This causes a problem of decrease in yield.

CITATION LIST

Patent Literature

Patent Literature 1: Japanese Unexamined Patent publication (Kokai) No. H09-235182

SUMMARY OF INVENTION

It is an object of the present invention to provide a method for detecting a diameter of a single crystal that enables detection precision to be improved, and a single-crystal manufacturing method and single-crystal manufacturing apparatus that enable the diameter to be precisely controlled on the basis of the result of the detection and enable the single crystal to be industrially stably grown at a good yield.

To solve this object, the present invention provides a method for detecting a diameter of a single crystal at the time of pulling the single crystal from a silicon melt contained in a crucible according to the Czochralski method, the method comprising at least: using two cameras placed in such a manner that the cameras keep the same distance from each other as a target diameter upon forming a straight-body portion of the single crystal and face both ends of the diameter of the single crystal in a growth point of the single crystal respectively, to separately capture both of the ends of the growth point of the single crystal from an outside of a furnace, the growth point being a contact point between the single crystal and a melt surface; and detecting the diameter of the single crystal on the basis of captured images.

In this manner, when using two cameras placed in such a manner that the cameras keep the same distance from each other as the target diameter upon forming the straight-body portion of the single crystal and face both ends of the diameter of the single crystal in the growth point of the single crystal respectively, to separately capture both of the ends of the growth point of the single crystal from the outside of the furnace; and detecting the diameter of the single crystal on the basis of the captured images, the diameter of the single crystal can be detected with reference to the target diameter of the single crystal. The diameter of the single crystal can be thereby detected without being influenced by a detection error due to the change in a relative position of the cameras and the single crystal, the error which has been caused by a conventional method for detecting. In addition to this, the detection precision of the diameter of the single crystal and the yield of the single crystal can be improved.

Moreover, in the method for detecting a diameter of a single crystal according to the present invention, the diameter of the single crystal is preferably detected by means of detecting each distance in a horizontal direction between one end of the growth point of the single crystal in one of the images captured by the two cameras and a center of the one of the captured images and by summing up the detected distances so that a difference of the diameter of the single crystal from the target diameter of the single crystal is obtained.

In this manner, when the diameter of the single crystal is detected by means of obtaining the difference of the diameter of the single crystal from the target diameter of the single crystal, the diameter of the single crystal can be detected with reference to the target diameter of the single crystal. The magnitude relation between the detected diameter and the target diameter of the single crystal can be, thereby, accurately and quickly distinguished on the basis of the difference of the diameter of the single crystal. Moreover, by obtaining the difference of the diameter of the single crystal from a distance in horizontal direction in the images, the diameter of the single crystal can be detected with high precision without being influenced by a detection error due to the change in vertical direction in the relative position of the cameras and the single crystal.

Moreover, the diameter of the single crystal can be detected by using one camera or two cameras for detecting a cone-portion diameter upon forming a cone-portion of the single crystal, and the diameter of the single crystal can be detected by using the two cameras for detecting a straight-body diameter upon forming the straight-body portion of the single crystal.

In this manner, when the diameter of the single crystal is measured by using different cameras upon forming the cone-portion and the straight-body portion of the single crystal, cameras having a narrow capturing view can be used, and a large diameter of the single crystal can be surely precisely detected.

Furthermore, the present invention provides a single-crystal manufacturing method including at least: detecting a diameter of a single crystal by the method according to any one of the above-described method; and pulling the single crystal to manufacture while controlling the diameter of the single crystal on the basis of a result of the detection.

As described above, the diameter of the single crystal can be precisely detected without being influenced by the change in the relative position of the cameras and the single crystal by the method for detecting a diameter of a single crystal according to the present invention. The present invention can control the diameter of the single crystal with high precision on the basis of the result of this detection, and the single crystal having a stable diameter can be therefore manufactured at a good yield.

Furthermore, the present invention provides a single-crystal manufacturing apparatus for manufacturing a silicon single crystal by pulling the single crystal from a silicon melt contained in a crucible according to the Czochralski method, the single-crystal manufacturing apparatus comprising at least: a crucible for containing the silicon melt; cameras for capturing a growth point of the single crystal from an outside of a furnace, the growth point being a contact point between the single crystal and a melt surface; and a diameter-controlling unit for controlling a diameter of the single crystal, wherein the cameras are placed in such a manner that two cameras keep the same distance from each other as a target diameter upon forming a straight-body portion of the single crystal and face both ends of the diameter of the single crystal in the growth point of the single crystal respectively; the diameter of the single crystal is detected on the basis of images of both of the ends of the growth point of the single crystal, the images being captured by the two cameras; and the diameter of the single crystal is controlled on the basis of a result of the detection by the diameter-controlling unit.

In this manner, in the single-crystal manufacturing apparatus according to the present invention, the diameter of the single crystal is detected on the basis of the images of both of the ends of the growth point of the single crystal, the images being captured by using the two cameras placed in such a manner that the two cameras keep the same distance from each other as the target diameter upon forming the straight-body portion of the single crystal and face both ends of the diameter of the single crystal in the growth point of the single crystal respectively, and the diameter of the single crystal is controlled on the basis of the result of the detection. The single-crystal manufacturing apparatus can thereby detect the diameter of the single crystal with reference to the target diameter of the single crystal, and can precisely detect the diameter of the single crystal without the error, even when the relative position of the cameras and the single crystal changes. In addition, the single-crystal manufacturing apparatus can precisely control the diameter of the single crystal on the basis of the result of the detection of the diameter of the single crystal, and can therefore improve a production yield of the single crystal.

Moreover, the single-crystal manufacturing apparatus according to the present invention preferably detects the diameter of the single crystal by means of detecting each distance in a horizontal direction between one end of the growth point of the single crystal in one of the images captured by the two cameras and a center of the one of the captured images and by summing up the detected distances so that a difference of the diameter of the single crystal from the target diameter of the single crystal is obtained.

The diameter of the single crystal can be thereby detected with reference to the target diameter upon forming the straight-body portion of the single crystal. The single-crystal manufacturing apparatus can, thereby, accurately and quickly distinguish the magnitude relation between the detected diameter and the target diameter of the single crystal. In addition, the single-crystal manufacturing apparatus can detect the diameter of the single crystal with high precision without being influenced by the detection error due to the change in a vertical direction in the relative position of the cameras and the single crystal, by obtaining the difference of the diameter of the single crystal from a distance in horizontal direction in the images.

Moreover, in the single-crystal manufacturing apparatus according to the present invention, it is preferable that the two cameras are placed for detecting a straight-body diameter upon forming the straight-body portion of the single crystal and other than the two cameras, one camera or two cameras are placed for detecting a cone-portion diameter upon forming a cone-portion of the single crystal.

In this manner, when the cameras are placed separately by use as cameras for detecting the cone-portion diameter and the straight-body diameter of the single crystal, cameras having a narrower capturing view can be placed in comparison with the case of measuring the diameter of the single crystal by one camera regardless of use. In addition, when the cameras having a narrower capturing view can be used, the single-crystal manufacturing apparatus can surely precisely detect a large diameter of the single crystal.

As mentioned above, the diameter of the single crystal can be precisely detected by the method for detecting a diameter of a single crystal according to the present invention. The diameter of the single crystal can be controlled with high precision on the basis of the result of this detection. The single crystal having a stable diameter can be therefore manufactured at a good yield.

DESCRIPTION OF EMBODIMENTS

Hereinafter, the present invention will be explained in more detail.

As described above, the meniscus ring, which is seen at the boundary between the crystal and the melt surface, is conventionally captured by one camera to detect the diameter of the single crystal on the basis of the captured image. This method generates the detection error of the diameter of the single crystal by changing the relative position of the camera and the single crystal due to a positional difference of the camera or the change in the position of the melt surface.

In view of this, the present inventors conceived that when the diameter of the single crystal is detected by using the two cameras placed in such a manner that the cameras keep the same distance from each other as the target diameter upon forming the straight-body portion of the single crystal and face both ends of the diameter of the single crystal in the growth point of the single crystal respectively, the diameter of the single crystal can be detected without being influenced by the change in the relative position of the cameras and the single crystal. Moreover, the present inventors attempted to detect the diameter of the single crystal on the basis of the target diameter upon forming the straight-body portion of the single crystal.

Specifically, two cameras were used and placed so as to keep the same distance from each other as the target diameter upon forming the straight-body portion of the single crystal, and further to face both ends of the diameter of the single crystal in the growth point of the single crystal respectively. That is, the two cameras were placed at the positions where the two cameras kept the same distance from each other as the target diameter of the single crystal so that a straight line that connects the cameras to each other and both of the ends of the growth point of the single crystal on the surface of the silicon melt contained in the crucible were parallel. With these cameras, both of the ends of the growth point of the single crystal were separately captured from the outside of the furnace, and the diameter of the single crystal was detected on the basis of the captured images.

As a result, it was revealed that the detected diameter of the single crystal was the same as an actual diameter of the single crystal.

By using a single crystal having the same diameter as above, the diameter of the single crystal was subsequently detected after changing a placing angle of the cameras. As a result, it was revealed that the detected diameter was the same as an actual diameter of the single crystal.

Figure 2:
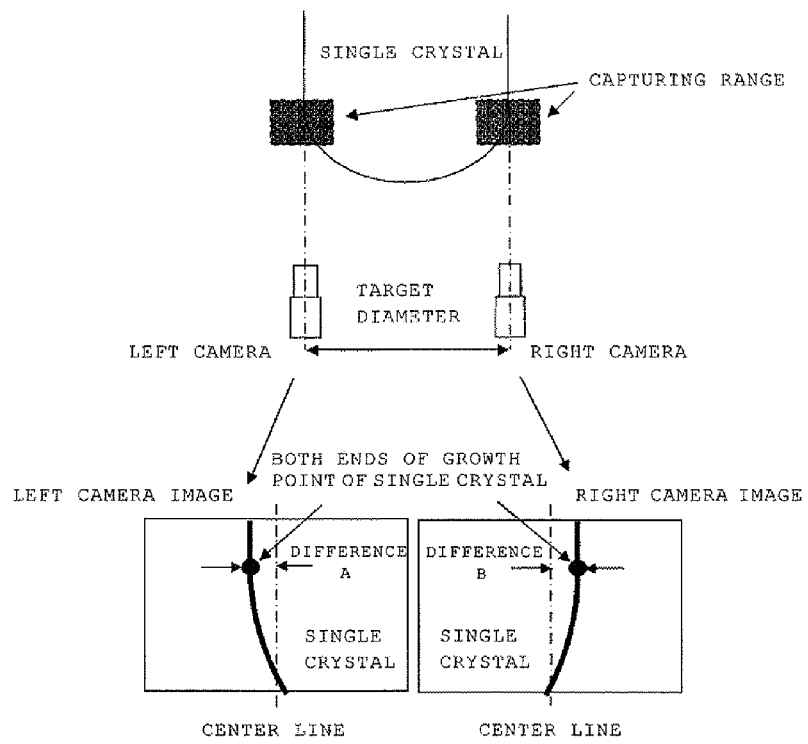
FIG. 2 is a schematic view of a capturing range of the cameras and a camera image in the present invention.
Figure 3:
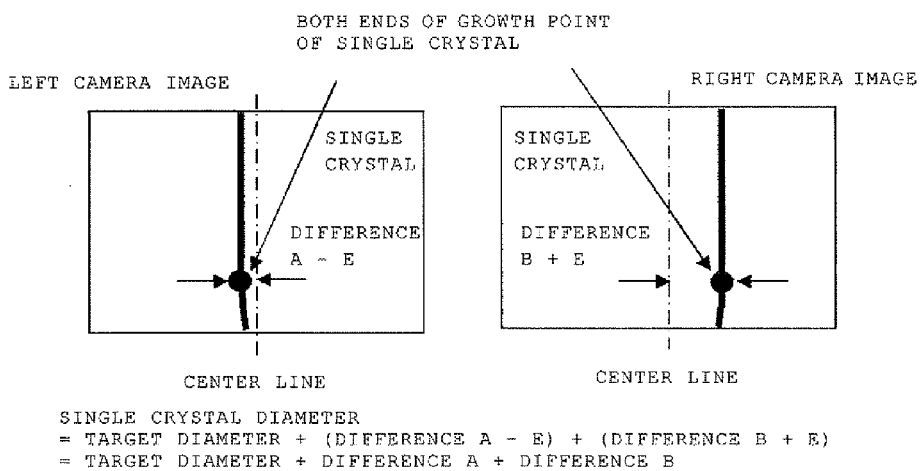
FIG. 3 is a schematic view of a camera image in the case of changing a placing angle of the cameras, in the present invention.

Here, FIG. 2 is a schematic view of a capturing range of the camera and a camera image in the present invention. FIG. 3 is a schematic view of a camera image in the case of changing the placing angle of the cameras of the single-crystal manufacturing apparatus according to the present invention.

In this case, since the two cameras are placed at the positions where the two cameras keep the same distance from each other as the target diameter, it can be considered that center lines of the images in FIGS. 2 and 3 keep the same distance from each other as both ends of the target diameter. For example, as shown in FIG. 2, the diameter of the single crystal can be accordingly detected as the target diameter+a difference A+a difference B. In this case, even when the placing angles of the cameras are changed, as shown in FIG. 3, the diameter of the single crystal is presented by the target diameter+a difference A+a difference B, and is the same as that before changing the placing angle of the cameras.

It was thus revealed that the diameter of the single crystal can be detected on the basis of the target diameter of the single crystal by detecting each distance in horizontal direction of the images, and the change in the position in vertical direction can be ignored.

Moreover, it was also revealed that it does not affect the detection of the diameter of the single crystal by keeping the distance between the two cameras the same distance as the target diameter of the single crystal, the target diameter which is the basis, as long as both of the ends of the growth point of the single crystal can be captured within the capturing range of the cameras.

Furthermore, in the event that both of the ends of the growth point of the single crystal were on the center line of each of the images captured by the two cameras, that is, in the event that the diameter of the single crystal was the same as the target diameter, the diameter of the single crystal was detected after changing the relative position of the cameras and the single crystal by making the melt surface descend. A schematic view of the images captured by the cameras in this case is shown in FIG. 4.

Figure 4:
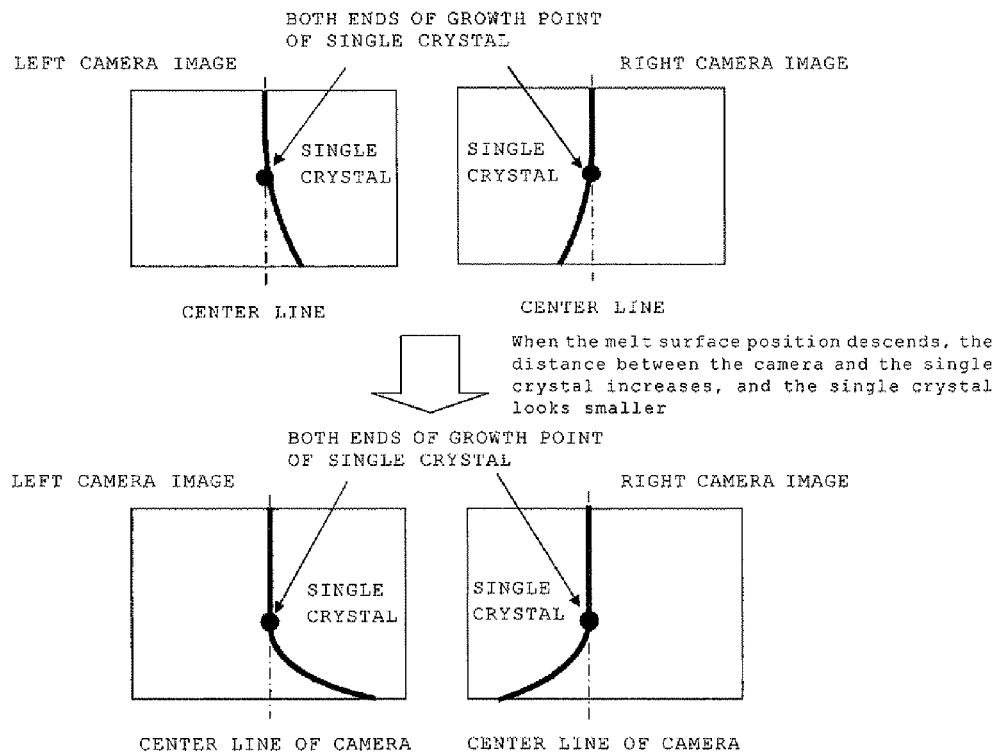
FIG. 4 is a schematic view of a camera image when the melt surface is made to descend with the diameter of the single crystal being the same as the target diameter, in the present invention.

As shown in FIG. 4, it was revealed that the single crystal looks smaller due to the change in the relative position of the cameras and the single crystal, but both of the ends of the growth point of the single crystal are always on the center lines of the images respectively. The diameter of the single crystal can be therefore detected without being influenced by the change in the relative position of the cameras and the single crystal. That is, when the distance between the cameras and an object to be captured changes due to the change in the relative position of the cameras and the object to be captured, the center position of the images of the object to be captured by the cameras does not change, and only a size thereof in the images changes. Therefore, when the diameter is the same as the target diameter, and even when the position of the melt surface changes, a detection point is on the center line of the images of the cameras.

It was also revealed that when the diameter of the single crystal is detected on the basis of the target diameter of the single crystal as described above, the magnitude relation between the detected diameter and the target diameter can be accurately distinguished, and the single crystal having a stable diameter can be thereby manufactured by precisely and quickly controlling the diameter of the single crystal.

The present invention was brought to completion on the basis of the above-described discovery. Hereinafter, the present invention will be explained in more detail with reference to the drawings, but the present invention is not restricted thereto.

Figure 1:
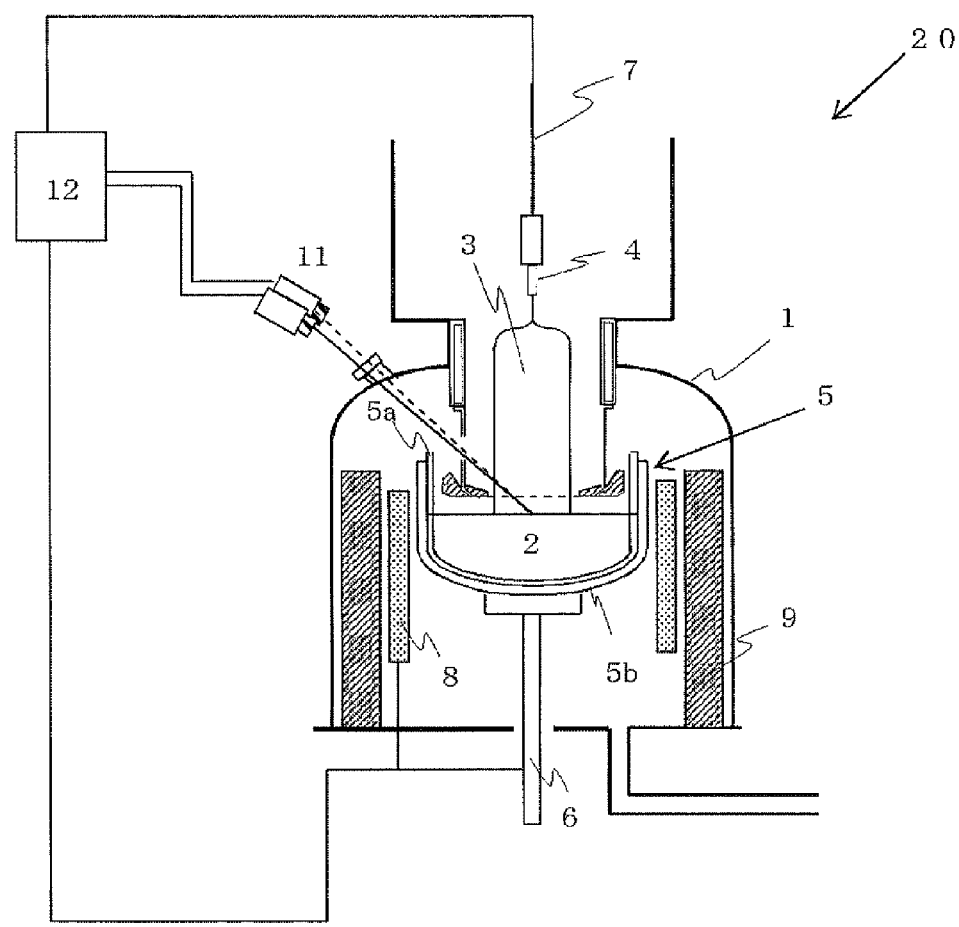
FIG. 1 is a schematic view showing an example of the single-crystal manufacturing apparatus according to the present invention.

FIG. 1 is a schematic view showing an example of the single-crystal manufacturing apparatus according to the present invention.

The single-crystal manufacturing apparatus 20 includes a hollow cylindrical chamber 1, and the crucible 5 is provided at a center portion thereof. The crucible has a double structure which is constituted of an inner holding vessel made of quartz that has a bottomed cylindrical shape (hereinafter, simply referred to as "a quartz crucible 5a"), and an outer holding vessel made of graphite that also has a bottomed cylindrical shape, the outer holding vessel which is adapted to hold an outer surface of the quartz crucible 5a ("a graphite crucible 5b").

These crucibles 5 are fixed to an upper end of a supporting shaft 6 so as to allow the crucibles to rotate and to move upwardly and downwardly. A resistance heating heater 8 is provided outside the crucibles substantially concentrically. A heat-insulating material 9 is further provided concentrically around the outside of the heater 8. The silicon melt 2 obtained by melting a silicon raw material with the heater 8 is contained in the crucible.

A pulling wire (or a pulling shaft, and hereinafter, these are referred to as "a pulling member 7") configured to rotate about the same axis with the supporting shaft 6 at a predetermined speed in the same direction or the opposite direction to that of the supporting shaft is provided along a central axis of the crucible 5 filled with the silicon melt 2, and a seed crystal 4 is held at a lower end of the pulling member 7. The silicon single crystal 3 is formed at a lower end face of the seed crystal 4.

The single-crystal manufacturing apparatus 20 further includes the cameras 11 for capturing the growth point of the single crystal from the outside of a furnace, the growth point which is a contact point between the single crystal 3 and the melt surface, and the diameter-controlling unit 12 for controlling the diameter of the single crystal 3.

The diameter-controlling unit 12 outputs a signal to the supporting shaft 6 and the pulling member 7 or the heater 8 according to the result of the detection of the diameter of the single crystal obtained by using the cameras 11, and the diameter of the single crystal is controlled by controlling a crucible position, a crucible ascending speed, a seed crystal position, a pulling rate, a heater power, or the like.

In the single-crystal manufacturing apparatus 20, the diameter of the single crystal is detected on the basis of images of both of the ends of the growth point of the single crystal, the images being captured by the two cameras 11 placed in such a manner that the two cameras keep the same distance from each other as the target diameter upon forming the straight-body portion of the single crystal 3 and face both ends of the diameter of the single crystal in the growth point of the single crystal respectively, and the diameter of the single crystal is controlled on the basis of the result of the detection. The single-crystal manufacturing apparatus can thereby detect the diameter of the single crystal with reference to the target diameter of the single crystal 3, and can precisely detect the diameter of the single crystal without the error, even when the relative position of the cameras 11 and the single crystal 3 changes. In addition, the single-crystal manufacturing apparatus can precisely control the diameter of the single crystal on the basis of the result of the detection of the diameter of the single crystal, and can consequently improve a production yield of the single crystal.

In this case, as shown in FIG. 2, the single-crystal manufacturing apparatus preferably detects the diameter of the single crystal by means of detecting each distance in a horizontal direction (differences A and B in FIG. 2) between one end of the growth point of the single crystal in one of the images captured by the two cameras and the center of the one of the captured images and by summing up the detected distances so that the difference of the diameter of the single crystal from the target diameter of the single crystal is obtained.

As shown in FIG. 2, the diameter of the single crystal can be thereby detected with reference to the target diameter upon forming the straight-body portion of the single crystal, as the diameter of the single crystal=the target diameter+a difference A+a difference B. Therefore, the single-crystal manufacturing apparatus can accurately and quickly distinguish the magnitude relation between the detected diameter and the target diameter of the single crystal. In addition, the single-crystal manufacturing apparatus can detect the diameter of the single crystal with high precision without being influenced by the detection error due to the change in vertical direction in the relative position of the cameras and the single crystal, by obtaining the difference of the diameter of the single crystal from a distance in horizontal direction in the images.

Moreover, in the above-described manufacturing apparatus, the two cameras may be placed for detecting the straight-body diameter upon forming the straight-body portion of the single crystal as described above and other than the two cameras, one camera or two cameras may be placed for detecting the cone-portion diameter upon forming a cone-portion of the single crystal.

In this manner, when the cameras for detecting the cone-portion diameter and the straight-body diameter of the single crystal are placed separately by use, cameras having a narrower capturing view can be placed in comparison with the case of measuring the diameter of the single crystal by one camera regardless of use. In addition, when the cameras having a narrow capturing view can be used, the single-crystal manufacturing apparatus can surely precisely detect a large diameter of the single crystal.

In the present invention, when a silicon single crystal is pulled from the melt contained in the crucible by the CZ method, for example, by using the above-described single-crystal manufacturing apparatus, the diameter of the single crystal is detected by the following method.

First, as shown in FIG. 2, both of the ends of the growth point of the single crystal are separately captured to obtain images by using right and left two cameras. Next, the diameter of the single crystal is detected on the basis of the images.

In this case, as shown in FIG. 2, the right and left two cameras are placed at the positions where the cameras kept the same distance from each other as the target diameter so as to face both of the ends of the growth point of the single crystal respectively, and the cameras are used to capture from the outside of the furnace. The diameter of the single crystal can be thereby detected with reference to the target diameter of the single crystal. The diameter of the single crystal can be therefore detected without being influenced by the detection error due to the change in the relative position of the cameras and the single crystal, the error which has been caused by a conventional detecting method. The detection precision of the diameter of the single crystal and the yield of the single crystal can be consequently improved.

In this case, as shown in FIG. 2, the diameter of the single crystal is preferably detected by means of detecting each distance in a horizontal direction (differences A and B in FIG. 2) between one end of the growth point of the single crystal in one of the images captured by the two cameras and a center of the one of the captured images and by summing up the detected distances so that the difference of the diameter of the single crystal from the target diameter of the single crystal is obtained.

As shown in FIG. 2, this enables the diameter of the single crystal to be detected with reference to the target diameter upon forming the straight-body portion of the single crystal as the diameter of the single crystal=the target diameter a difference A+a difference B. Thereby, the magnitude relation between the detected diameter and the target diameter of the single crystal can be accurately and quickly distinguished. Moreover, by obtaining the difference of the diameter of the single crystal from the distance in horizontal direction in the images, the diameter of the single crystal can be detected with high precision without being influenced by the detection error due to the change in vertical direction in the relative position of the cameras and the single crystal.

Moreover, the diameter of the single crystal may be also detected by using one camera or two cameras for detecting the cone-portion diameter upon forming the cone-portion of the single crystal, and the diameter of the single crystal may be detected by using the two cameras for detecting the straight-body diameter upon forming the straight-body portion of the single crystal.

As described above, a large diameter of the single crystal can be precisely detected by measuring the diameter of the single crystal with different cameras upon forming the cone-portion and the straight-body portion of the single crystal, even when the cameras having a narrow capturing view is used to measure it.

The diameter of the single crystal can be precisely detected by detecting the diameter of the single crystal as described above. Moreover, the diameter can be controlled with high precision by pulling the single crystal with the diameter of the single crystal controlled on the basis of the result of the detection, and the single crystal having a stable diameter can be consequently manufactured at a good yield.

EXAMPLE

Next, the present invention will be explained in more detail with reference to Example and Comparative Example, but the present invention is not restricted thereto.

Example

With the single-crystal manufacturing apparatus as shown in FIG. 1, a silicon raw material was charged in the crucible, and the silicon raw material was melted with the heater to obtain the silicon melt. A silicon single crystal having a diameter of 203 mm was pulled to manufacture while the diameter of the single crystal was detected by using the two cameras as shown in FIG. 2 and controlled on the basis of the result of the detection. The actual diameter of the manufactured single crystal was thereafter measured after taking it out to the outside of the furnace. Here, the actual diameter of the single crystal and the detection result are shown in FIG. 5.

Figure 5:
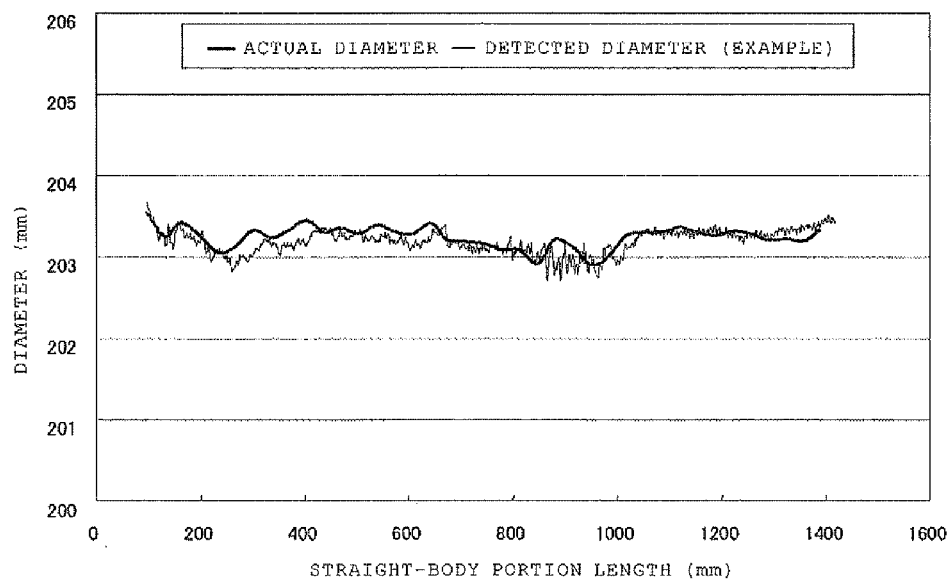
FIG. 5 is a view showing the result of the detection and an actual diameter of the single crystal in Example.

As shown in FIG. 5, it is revealed that the detection result of the diameter of the single crystal during pulling the single crystal was approximately the same as the actual diameter of the single crystal, and that the diameter of the single crystal was able to be stably controlled with precision of within 1 mm.

Comparative Example

At the time of pulling the single crystal in Example, the meniscus ring, which was seen at the boundary between the crystal and the melt surface, was captured by using one camera, which was different from the two cameras for controlling the diameter, like a conventional method for detecting the diameter of the single crystal. The diameter of the single crystal was detected on the basis of the captured image. Here, the actual diameter of the single crystal and the detection result are shown in FIG. 6.

Figure 6:
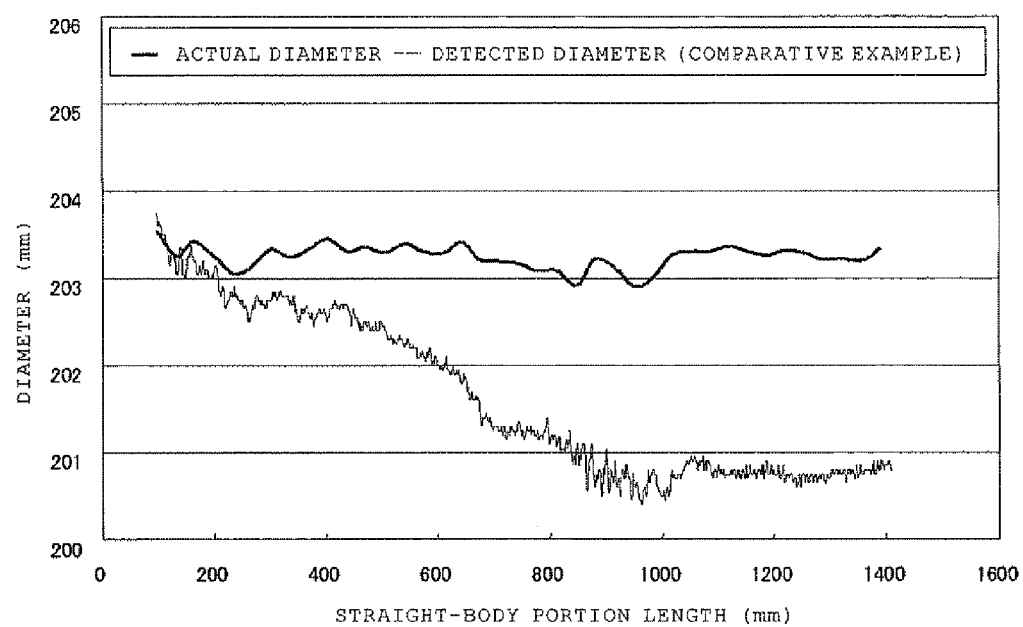
FIG. 6 is a view showing the result of the detection and an actual diameter of the single crystal in Comparative Example.
Figure 7:
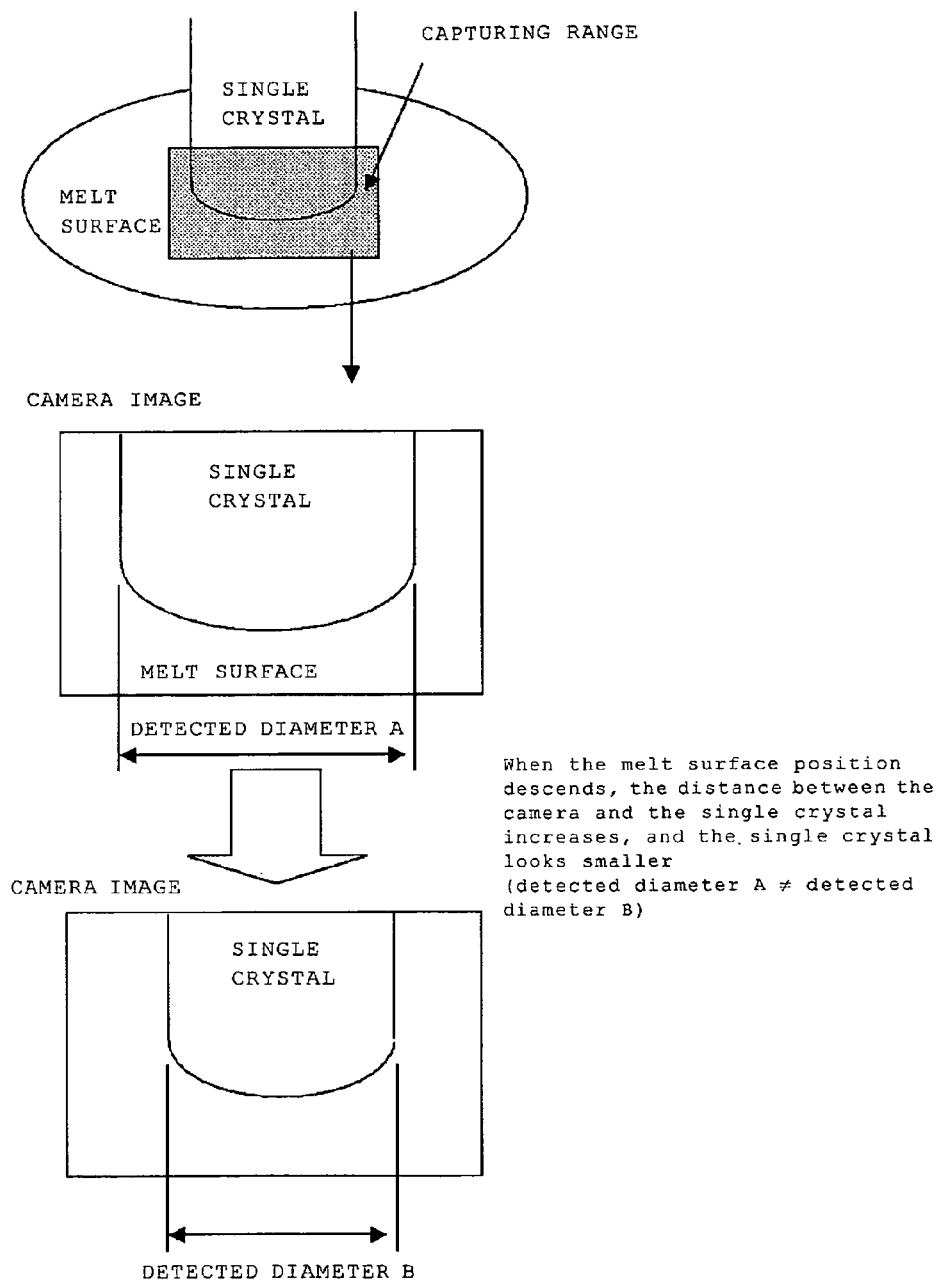
FIG. 7 is a schematic view of a conventional capturing range and an image of a camera.

As shown in FIG. 6, the detection result of the diameter of the single crystal shows that a smaller diameter is detected as the pulling proceeds, and it is thus revealed that a tapered crystal, in which the diameter thereof gradually increases in the direction of the length of the straight-body portion, would be obtained, if the diameter of the single crystal is controlled on the basis of this detection result. In addition, there is an error of 2 mm or more from the actual diameter of the single crystal. It can be considered that this was caused by a measurement error due to the change in the position of the melt surface.

It is thus confirmed that in Example, the diameter of the single crystal that was approximately the same as the actual diameter was able to be detected from the beginning to the end of the straight-body portion of the single crystal, and the crystal having a stable diameter with precision of within 1 mm with respect to a desired diameter was able to be obtained. On the other hand, in Comparative Example, the detection error of the diameter of the single crystal was 2 mm or more, and the crystal having a desired diameter was not consequently able to be obtained.

As explained above, the diameter of the single crystal can be precisely detected by the method for detecting a diameter of a single crystal according to the present invention. Moreover, by the single-crystal manufacturing method and apparatus according to the present invention, the single crystal can be pulled while the diameter of the single crystal is precisely detected and controlled on the basis of the detection result, and the diameter of the single crystal can be thus controlled with high precision. As a result, the single crystal can be manufactured at a good yield.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:
1. A method for detecting a diameter of a single crystal at the time of pulling the single crystal from a silicon melt contained in a crucible according to the Czochralski method, the method comprising at least:
using two cameras placed in such a manner that the cameras keep the same distance from each other as a target diameter of a straight-body portion of the single crystal and face both ends of the diameter of the single crystal in a growth point of the single crystal respectively, to separately capture both of the ends of the growth point of the single crystal from an outside of a furnace, the growth point being a contact point between the single crystal and a melt surface; and
detecting the diameter of the single crystal on the basis of captured images, wherein
the diameter of the single crystal is detected by means of detecting each distance in a horizontal direction between one end of the growth point of the single crystal in the respective images captured by the two cameras and a center of the captured images and by summing up the detected distances so that a difference of the diameter of the single crystal with respect to the target diameter of the single crystal is obtained.

2. The method for detecting a diameter of a single crystal according to claim 1, wherein the diameter of the single crystal is detected by using one camera or two cameras for detecting a cone-portion diameter upon forming a cone-portion of the single crystal, and the diameter of the single crystal is detected by using the two cameras for detecting a straight-body diameter upon forming the straight-body portion of the single crystal.

3. A single-crystal manufacturing method including at least: detecting a diameter of a single crystal by the method according to claim 1; and pulling the single crystal while controlling the diameter of the single crystal on the basis of a result of the detection.

4. A single-crystal manufacturing method including at least: detecting a diameter of a single crystal by the method according to claim 2; and pulling the single crystal while controlling the diameter of the single crystal on the basis of a result of the detection.

* * * * *